(12) United States Patent
Asaba et al.

(10) Patent No.: US 10,103,192 B2
(45) Date of Patent: Oct. 16, 2018

(54) PHOTOELECTRIC CONVERSION ELEMENT, IMAGE READING DEVICE, AND IMAGE FORMING APPARATUS

(71) Applicants: Naoki Asaba, Kanagawa (JP); Masamoto Nakazawa, Kanagawa (JP)

(72) Inventors: Naoki Asaba, Kanagawa (JP); Masamoto Nakazawa, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 15/376,074

(22) Filed: Dec. 12, 2016

(65) Prior Publication Data
US 2017/0170225 A1    Jun. 15, 2017

(30) Foreign Application Priority Data

Dec. 14, 2015   (JP) ................. 2015-243355

(51) Int. Cl.
*H01L 27/146*    (2006.01)
*H04N 5/378*    (2011.01)
(Continued)

(52) U.S. Cl.
CPC .... *H01L 27/14636* (2013.01); *H01L 27/1463* (2013.01); *H01L 27/14645* (2013.01);
(Continued)

(58) Field of Classification Search
CPC ........... H01L 27/14636; H01L 27/1463; H01L 27/14645; H04N 9/045; H04N 5/378; H04N 5/37452
(Continued)

(56) References Cited

U.S. PATENT DOCUMENTS 5,665,959 A * 9/1997 Fossum ............. H01L 27/14658
                                       250/208.1
5,909,026 A * 6/1999 Zhou ..................... G11C 27/04
                                       250/208.1
(Continued)

FOREIGN PATENT DOCUMENTS

JP    2014-138406    7/2014
JP    2015-156557    8/2015

OTHER PUBLICATIONS

U.S. Appl. No. 15/191,035, filed Jun. 23, 2016.
U.S. Appl. No. 15/176,395, filed Jun. 8, 2016.

*Primary Examiner* — Pritham Prabhakher
(74) *Attorney, Agent, or Firm* — Oblon, McClelland, Maier & Neustadt, L.L.P.

(57) ABSTRACT

A photoelectric conversion element includes a plurality of light-receiving elements, a plurality of pixel circuits, and a plurality of storage units. The light-receiving elements are aligned in a predetermined alignment direction for each color of light to be received, to receive and convert the light into electric charge. The pixel circuits are disposed respectively adjacent to the plurality of light-receiving elements, to convert the electric charge generated by the corresponding light-receiving element into a voltage signal. The storage units are disposed respectively corresponding to the plurality of the pixel circuits, to store therein the voltage signal generated by the corresponding pixel circuit. The storage units are disposed in an adjacent region that is adjacent to a photoelectric conversion region in which the light-receiving elements and the pixel circuits are disposed.

26 Claims, 9 Drawing Sheets

(51) Int. Cl.
*H04N 5/3745* (2011.01)
*H04N 9/04* (2006.01)

(52) U.S. Cl.
CPC ......... *H04N 5/378* (2013.01); *H04N 5/37452* (2013.01); *H04N 9/045* (2013.01)

(58) Field of Classification Search
USPC .......................................................... 348/302
See application file for complete search history.

(56) References Cited

U.S. PATENT DOCUMENTS

| | | | | |
|---|---|---|---|---|
| 6,388,241 | B1* | 5/2002 | Ang | H04N 5/3692 250/208.1 |
| 8,040,418 | B2* | 10/2011 | Murata | H04N 9/045 348/323 |
| 8,860,858 | B2* | 10/2014 | Ono | H04N 5/335 348/262 |
| 9,491,327 | B2* | 11/2016 | Nakazawa | H04N 1/03 |
| 9,774,801 | B2* | 9/2017 | Hseih | H04N 5/35563 |
| 2007/0188638 | A1 | 8/2007 | Nakazawa et al. | |
| 2008/0252787 | A1 | 10/2008 | Nakazawa et al. | |
| 2010/0027061 | A1 | 2/2010 | Nakazawa | |
| 2010/0171998 | A1 | 7/2010 | Nakazawa | |
| 2011/0026083 | A1 | 2/2011 | Nakazawa | |
| 2011/0051201 | A1 | 3/2011 | Hashimoto et al. | |
| 2011/0063488 | A1 | 3/2011 | Nakazawa | |
| 2012/0008173 | A1 | 1/2012 | Konno et al. | |
| 2012/0092732 | A1 | 4/2012 | Nakazawa | |
| 2012/0224205 | A1 | 9/2012 | Nakazawa | |
| 2013/0063792 | A1 | 3/2013 | Nakazawa | |
| 2013/0176468 | A1* | 7/2013 | Ono | H04N 5/335 348/294 |
| 2013/0308023 | A1* | 11/2013 | Sugawa | H04N 5/3575 348/294 |
| 2014/0029065 | A1 | 1/2014 | Nakazawa | |
| 2014/0204427 | A1 | 7/2014 | Nakazawa | |
| 2014/0204432 | A1 | 7/2014 | Hashimoto et al. | |
| 2014/0211273 | A1 | 7/2014 | Konno et al. | |
| 2014/0368893 | A1 | 12/2014 | Nakazawa et al. | |
| 2015/0098117 | A1 | 4/2015 | Marumoto et al. | |
| 2015/0116794 | A1 | 4/2015 | Nakazawa | |
| 2015/0163378 | A1* | 6/2015 | Konno | H04N 1/486 358/483 |
| 2015/0222790 | A1 | 8/2015 | Asaba et al. | |
| 2015/0244959 | A1* | 8/2015 | Araoka | H04N 5/378 348/302 |
| 2015/0304517 | A1 | 10/2015 | Nakazawa et al. | |
| 2015/0341521 | A1 | 11/2015 | Asaba | |
| 2016/0003673 | A1 | 1/2016 | Hashimoto et al. | |
| 2016/0006961 | A1 | 1/2016 | Asaba et al. | |
| 2016/0088179 | A1* | 3/2016 | Nakazawa | H04N 1/03 358/482 |
| 2016/0094787 | A1* | 3/2016 | Govil | G06K 9/00986 348/310 |
| 2016/0112660 | A1 | 4/2016 | Nakazawa et al. | |
| 2016/0119495 | A1 | 4/2016 | Konno et al. | |
| 2016/0165159 | A1* | 6/2016 | Hseih | H04N 5/23235 348/273 |
| 2016/0173719 | A1 | 6/2016 | Hashimoto et al. | |
| 2016/0219163 | A1 | 7/2016 | Shirado et al. | |
| 2016/0219234 | A1* | 7/2016 | Nishihara | H04N 5/378 |
| 2016/0268330 | A1 | 9/2016 | Nakazawa et al. | |
| 2016/0295138 | A1 | 10/2016 | Asaba et al. | |

\* cited by examiner

PHOTOELECTRIC CONVERSION ELEMENT, IMAGE READING DEVICE, AND IMAGE FORMING APPARATUS

CROSS-REFERENCE TO RELATED APPLICATIONS

The present application claims priority under 35 U.S.C. § 119 to Japanese Patent Application No. 2015-243355, filed on Dec. 14, 2015. The contents of which are incorporated herein by reference in their entirety.

BACKGROUND OF THE INVENTION

1. Field of the Invention

The present invention relates to a photoelectric conversion element, an image reading device, and an image forming apparatus.

2. Description of the Related Art

A color complementary metal-oxide semiconductor (CMOS) linear image sensor that operates in a global shutter mode simultaneously exposes every pixel at the same instant in time and stores signals at once, and the signals are sequentially read out. In the global shutter mode, such simultaneous exposure can avoid spatial distortion that could occur in a rolling shutter mode, but each of the pixels needs an analog memory for storing the signal.

Such an analog memory and a pixel circuit including a floating diffusion that converts electric charge output from a photo diode into voltage occupy a certain area of a pixel to configure a circuit. In conventional linear image sensors, such an area occupied by the analog memory and the pixel circuit increases the gap between photo diodes in different colors, which is one of the factors that exacerbate color shift.

Japanese Unexamined Patent Application Publication No. 2015-156557 discloses a solid state imaging device including a plurality of pixels, a plurality of first charge accumulation circuits that output first pixel signals in accordance with signal charge, and a plurality of second charge accumulation circuits that output second pixel signals corresponding to signal charge that are reduced to a predetermined number of pixels.

However, such a conventional device cannot reduce color shift or prevent decrease in sensitivity.

SUMMARY OF THE INVENTION

According to one aspect of the present invention, a photoelectric conversion element includes a plurality of light-receiving elements, a plurality of pixel circuits, and a plurality of storage units. The light-receiving elements are aligned in a predetermined alignment direction for each color of light to be received, to receive and convert the light into electric charge. The pixel circuits are disposed respectively adjacent to the plurality of light-receiving elements, to convert the electric charge generated by the corresponding light-receiving element into a voltage signal. The storage units are disposed respectively corresponding to the plurality of the pixel circuits, to store therein the voltage signal generated by the corresponding pixel circuit. The storage units are disposed in an adjacent region that is adjacent to a photoelectric conversion region in which the light-receiving elements and the pixel circuits are disposed.

BRIEF DESCRIPTION OF THE DRAWINGS

The accompanying drawings are intended to depict exemplary embodiments of the present invention and should not be interpreted to limit the scope thereof. Identical or similar reference numerals designate identical or similar components throughout the various drawings.

DESCRIPTION OF THE EMBODIMENTS

Figure 1:
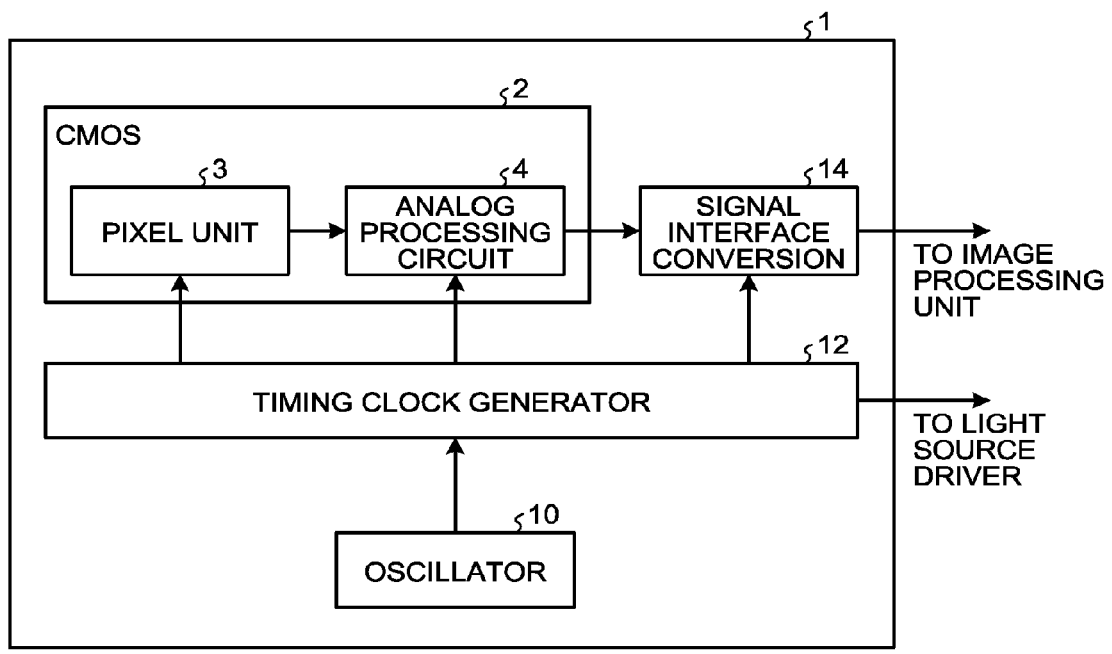
FIG. 1 is a block diagram illustrating an example of main components of a reading unit of an image reading device including a photoelectric conversion element according to an embodiment of the present invention.

The terminology used herein is for the purpose of describing particular embodiments only and is not intended to be limiting of the present invention.

As used herein, the singular forms "a", "an" and "the" are intended to include the plural forms as well, unless the context clearly indicates otherwise.

In describing preferred embodiments illustrated in the drawings, specific terminology may be employed for the sake of clarity. However, the disclosure of this patent specification is not intended to be limited to the specific terminology so selected, and it is to be understood that each specific element includes all technical equivalents that have the same function, operate in a similar manner, and achieve a similar result.

An embodiment of the present invention will be described in detail below with reference to the drawings.

An object of an embodiment is to provide a photoelectric conversion element, an image reading device, and an image forming apparatus that can reduce color shift without reducing sensitivity.

A photoelectric conversion element according to an embodiment of the present invention will be described with reference to the accompanying drawings. FIG. 1 is a block diagram illustrating an example of main components of a reading unit 1 of an image reading device 60 (see FIG. 9) including a photoelectric conversion element 2 according to the embodiment. As illustrated in FIG. 1, the reading unit 1 of the image reading device 60 includes an oscillator 10, a timing clock generator 12, a signal interface conversion 14, and the photoelectric conversion element 2.

The oscillator 10 generates a clock signal at a certain frequency determined in advance. The timing clock generator 12 receives the clock signal generated by the oscillator 10 and generates a timing clock that causes the photoelectric conversion element 2 and the signal interface conversion 14 to operate at predetermined timing.

The photoelectric conversion element 2 is a color CMOS linear sensor including, for example, a pixel unit 3 and an analog processing circuit 4. The pixel unit 3 includes a plurality of pixels that receive light in R, G, and B colors (details will be described with reference to FIG. 2). The analog processing circuit 4 performs, for example, analog-to-digital (A/D) conversion that converts analog pixel signals (voltage signals) output from the pixel unit 3 into digital signals. The signal interface conversion 14 converts the signals processed by the analog processing circuit 4 into signals in, for example, low voltage differential signaling (LVDS), and outputs them to a subsequent unit. The timing clock generator 12 and the signal interface conversion 14 may be included in, for example, the photoelectric conversion element 2.

Figure 2:
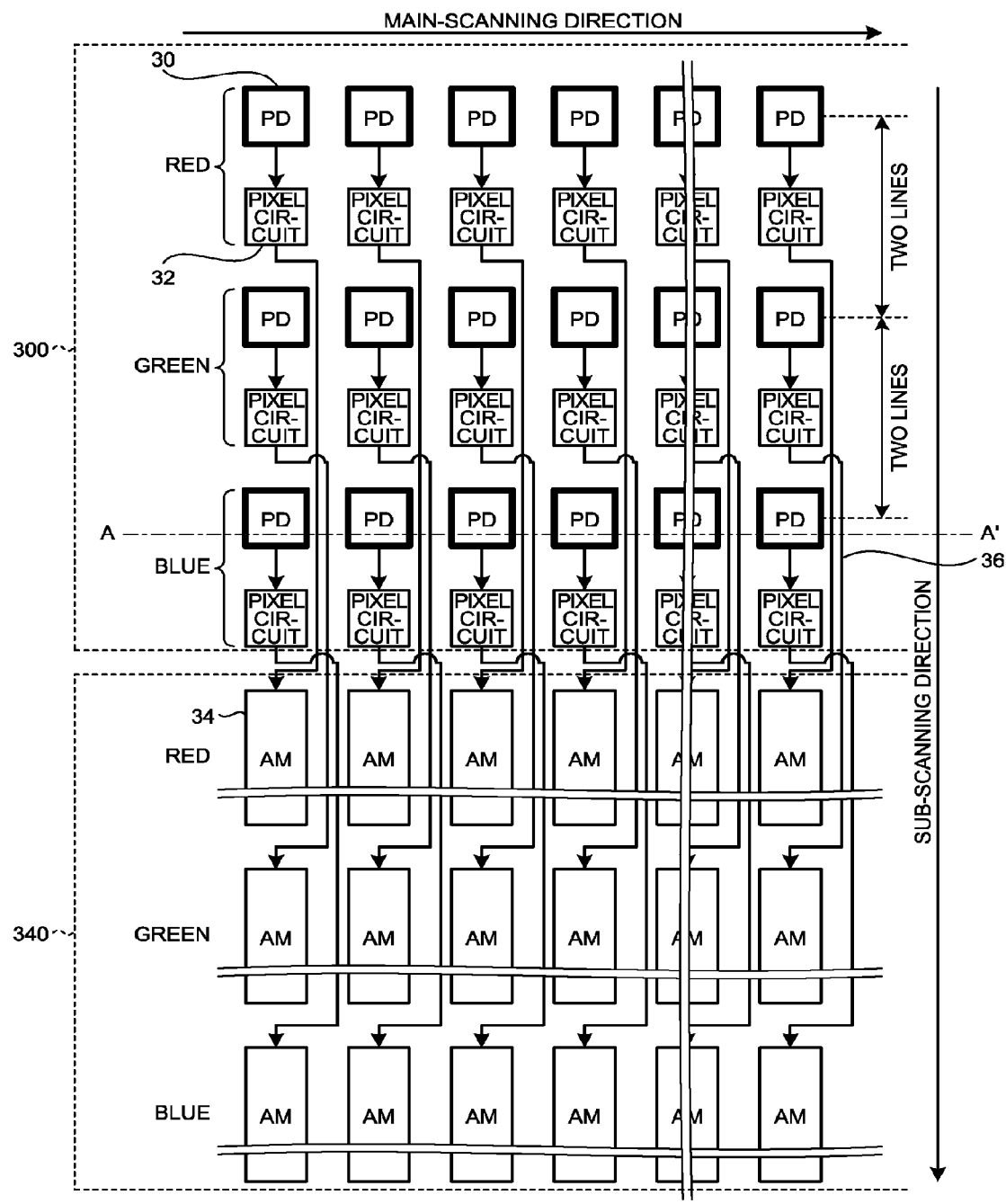
FIG. 2 is a diagram illustrating a first example of a configuration of a pixel unit.

FIG. 2 is a diagram illustrating a first example of a configuration of the pixel unit 3. As illustrated in FIG. 2, the pixel unit 3 includes light-receiving elements (photo diodes: PD) 30 that receive light in red, green, and blue colors and convert the light into electric charge. The light-receiving elements 30 are aligned in rows in a predetermined direction for each color of the light to be received. For example, about 7000 light-receiving elements 30 are aligned in a row for each color of the light to be received.

Each light-receiving element 30 is connected with a pixel circuit 32. The pixel circuit 32 includes, for example, a floating diffusion (FD) that converts electric charge generated by the light-receiving element 30 into voltage, and a reset transistor that resets the floating diffusion.

A plurality of analog memories (AM) 34 are disposed respectively corresponding to the light-receiving elements (and the pixel circuits 32). Each analog memory 34 is configured by, for example, a capacitor and serves as a storage unit that stores voltage output from the corresponding pixel circuit 32. Wires (signal lines) 36 connect these elements with each other.

In other words, in the pixel unit 3, the light-receiving elements 30 accumulate electric charge by photoelectric conversion, the pixel circuits 32 convert the electric charge into voltage, and the analog memories 34 store therein the voltage generated by the pixel circuits 32 for each pixel. Each circuit configuration includes a switch configured by a transistor, and the operation is switched by turning on and off the switch.

As illustrated in FIG. 2, the pixel unit 3 includes a photoelectric conversion region (pixel region) 300 in which the light-receiving elements 30 and the pixel circuits 32 are disposed, and an adjacent region 340 that is adjacent to the photoelectric conversion region 300 and in which the analog memories 34 are disposed.

When the floating diffusion in each pixel circuit 32 converts the electric charge accumulated in the corresponding light-receiving element 30 into voltage, the voltage is obtained in accordance with the following relation: $V=Q/C$, where V represents voltage, Q represents electric charge, and C represents capacitance. In other words, when parasitic capacitance of the floating diffusion is high, a low voltage is obtained, which results in decrease in sensitivity of the photoelectric conversion element 2. Thus, lower parasitic capacitance of the floating diffusion is desirable.

Examples of the parasitic capacitance of the floating diffusion include capacitance between terminals of the switch (transistor) (drain-source capacitance, gate-drain capacitance, gate-source capacitance), and wire capacitance between the light-receiving element 30 and the floating diffusion. In general, a smaller area of a switch circuit achieves a lower capacitance between terminals of the switch, and a shorter wire achieves a lower wire capacitance. Thus, each pixel circuit 32 has a small circuit area and is disposed close to the corresponding light-receiving element 30. The size of the pixel circuit 32 is smaller than that of the analog memory 34. The size of the analog memory 34 is several times to tens of times greater than that of the light-receiving element 30.

The linear image sensor in the image reading device reads an image of a subject while in relative motion to the subject in the sub-scanning direction. This configuration causes the linear image sensor to read the same part of the subject at different timing among different colors. Ideally, such time difference is determined according to the distance between photo diodes of different colors, optical magnification, and reading speed. To correct the time difference, in general, values read by the pixels of each color in the linear image sensor are corrected by delaying image signals of a certain color at a subsequent step.

In practice, however, vibration of the subject, change in reading speed, and change in intensity of the light source may cause color shift that cannot be corrected by the aforementioned method, and quality of a read image may deteriorate. Such color shift becomes significant when the distance between photo diodes of different colors increases. Thus, a shorter distance between photo diodes of different colors is desirable.

In the pixel unit 3, the light-receiving elements 30 are disposed adjacent to their respective pixel circuits 32 in the photoelectric conversion region 300. This configuration reduces color shift while preventing decrease in sensitivity. In the pixel unit 3, the relatively large analog memories 34 are disposed in the adjacent region 340 that is adjacent to the photoelectric conversion region 300. This configuration achieves a shorter distance between the light-receiving elements 30 of different colors and a shorter distance between the light-receiving elements 30 and the respective pixel circuits 32, and thus reduces color shift while preventing decrease in sensitivity.

The order of the colors assigned to the light-receiving elements 30 in the photoelectric conversion region 300 is the same as the order of the colors assigned to their respective analog memories 34 in the adjacent region 340. Specifically, the rows of the light-receiving elements 30 in the photoelectric conversion region 300 are arranged in the order of R, G, and B in the sub-scanning direction, and the rows of the analog memories 34 in the adjacent region 340 are arranged in the order of R, G, and B that are the colors assigned to the analog memories 34 (that are the colors of the signals to be stored in the analog memories 34). The circuit elements and wires in the photoelectric conversion element 2 are arranged in a regular order, thereby preventing a structural difference or production variance and reducing a difference in properties between pixels or colors.

In FIG. 2, the rows of the light-receiving elements 30 and the rows of the pixel circuits 32 are alternately arranged in the order of R, G, and B, but the arrangement pattern is not limited to this. The light-receiving elements 30 and the pixel circuits 32 may be arranged in other patterns as long as each of the light-receiving elements 30 is disposed adjacent to the corresponding pixel circuit 32.

Figure 3:
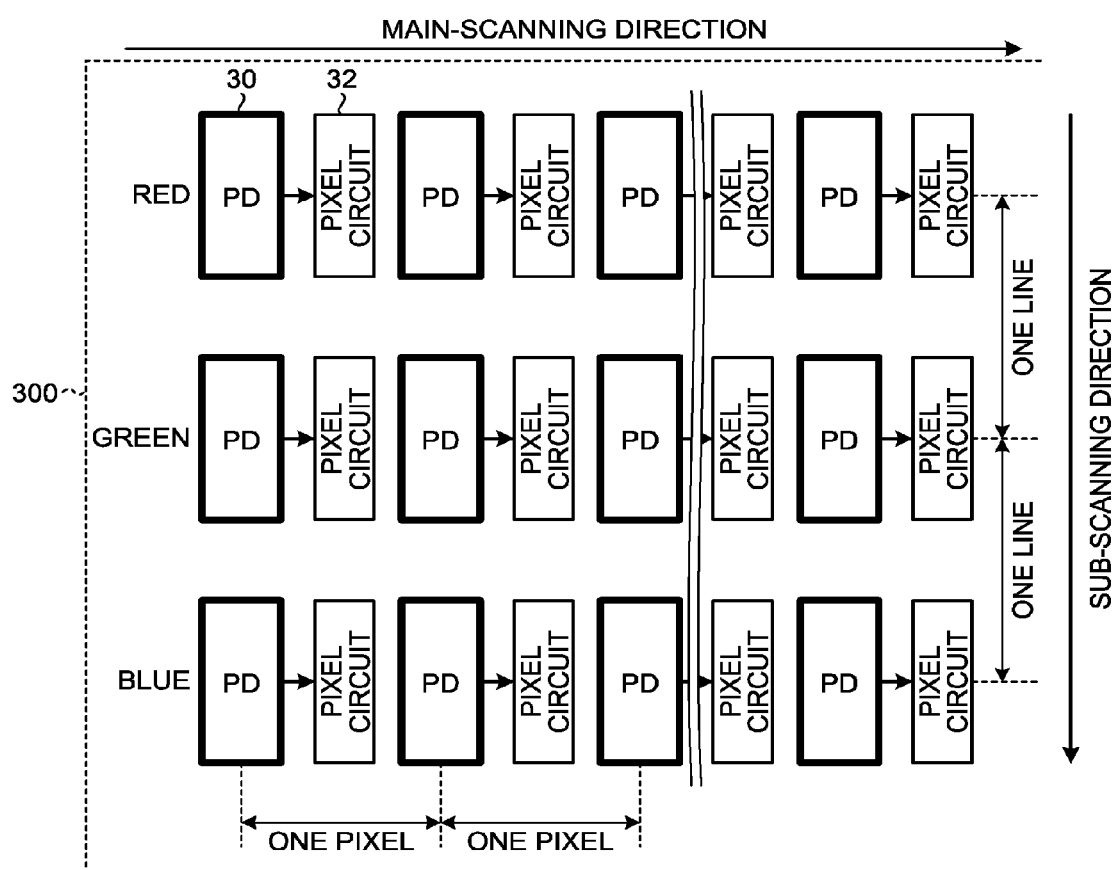
FIG. 3 is a diagram illustrating a second example of the configuration of the pixel unit.

FIG. 3 is a diagram illustrating a second example of the configuration of the pixel unit 3. As illustrated in FIG. 3, the pixel circuits 32 may be disposed adjacent to the respective light-receiving elements 30 in the direction in which the light-receiving elements 30 in each color are aligned (in the main-scanning direction). The second example of the configuration of the pixel unit 3 achieves a shortest distance between the light-receiving elements 30 of different colors. The adjacent region 340 may be disposed at the leading end or the trailing end of the sub-scanning direction with respect to the photoelectric conversion region 300.

Figure 4:
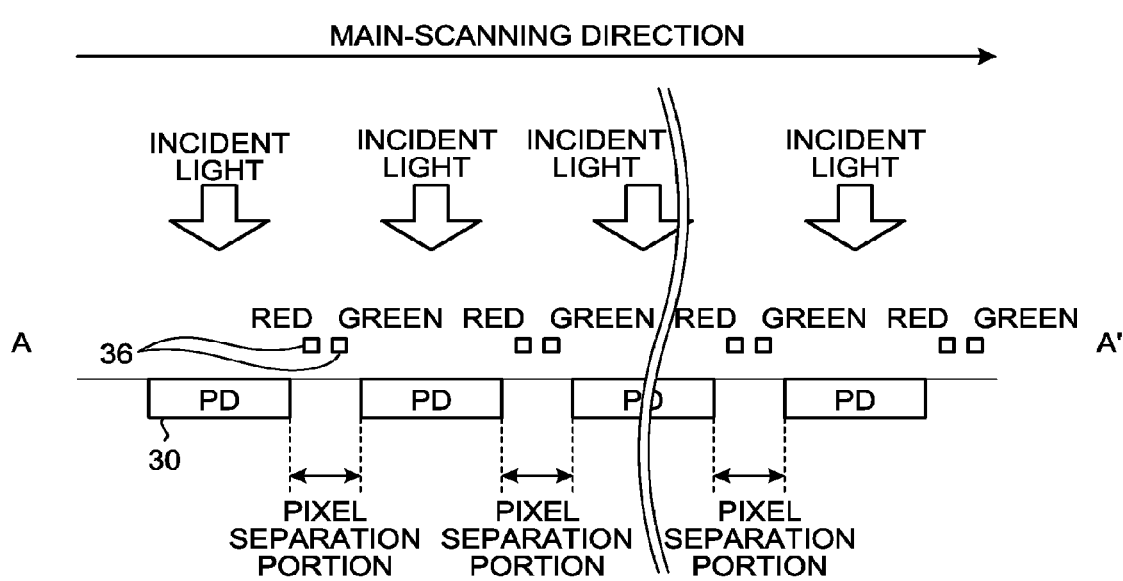
FIG. 4 is a diagram illustrating a cross section taken along line A-A' in FIG. 2.

FIG. 4 is a diagram illustrating a cross section taken along line A-A' in FIG. 2. As illustrated in FIG. 4, wires 36 that connect the pixel circuits 32 with the analog memories 34 are disposed in an upper layer of pixel separation portions and within a range overlapping the pixel separation portions in a direction perpendicular to a stacking direction of layers (within a width of each pixel separation portion). In other words, the wires 36 are disposed in the pixel unit 3 without reducing the fill factor of the light-receiving elements 30.

Although the example of FIG. 4 illustrates two wires 36 that transmit red and green image signals disposed at each pixel separation portion, three wires 36 for red, green, and blue signals may be disposed at each pixel separation portion or a single wire 36 for any one of these color signals may be disposed at each pixel separation portion depending on the pattern of the pixel circuits 32 and the analog memories 34. Although, in FIG. 4, the wires 36 for red and green image signals are disposed in the same wiring layer, these wires may be disposed in different wiring layers. The wires 36, in particular, cannot cross each other in the same wiring layer, and thus the wires 36 are disposed in different wiring layers when cross.

Figure 5:
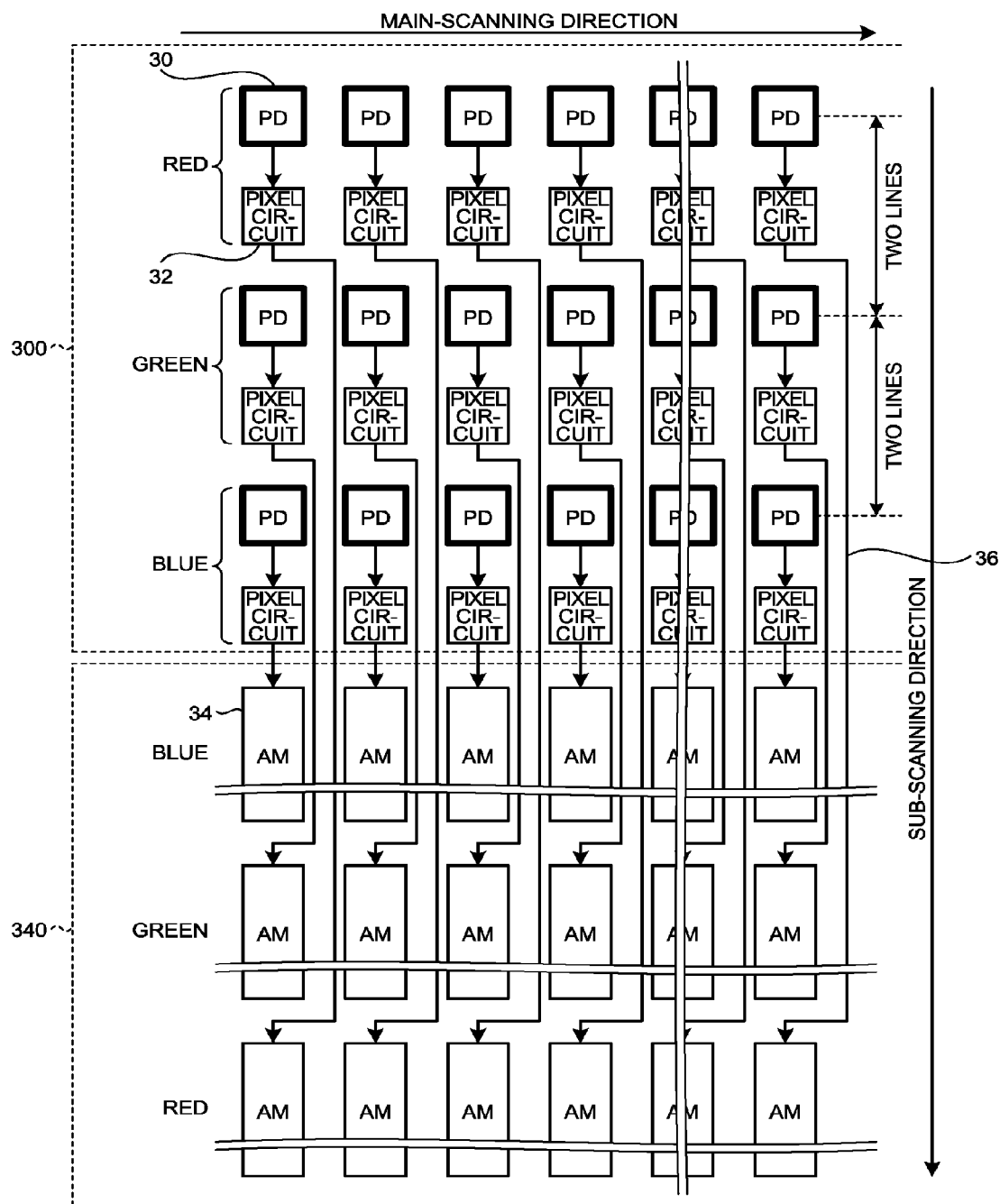
FIG. 5 is a diagram illustrating a third example of the configuration of the pixel unit.

FIG. 5 is a diagram illustrating a third example of the configuration of the pixel unit 3. In the configuration of the pixel unit 3 according to the third example as illustrated in FIG. 5, the order of the colors assigned to the light-receiving elements 30 in the photoelectric conversion region 300 is a reverse order relative to the order of the colors assigned to the analog memories 34 in the adjacent region 340. Specifically, the rows of the light-receiving elements 30 and the rows of the pixel circuits 32 are arranged in the order of red, green, and blue in the sub-scanning direction, whereas the rows of the analog memories 34 are arranged in the order of blue, green, and red in the sub-scanning direction. The order of the colors is not limited to this. The order of the colors may be any order as long as the rows of the analog memories 34 are arranged in a reverse order relative to the order of the rows of the light-receiving elements 30 and the rows of the pixel circuits 32 with respect to the colors. The order of red, green, and blue may be changed, or the adjacent region 340 may be disposed at the leading end of the sub-scanning direction.

With this configuration, the rows of the light-receiving elements 30 and the pixel circuits 32 and the rows of the analog memories 34 are symmetrically disposed in terms of the colors, which enables the wires 36 to connect the pixel circuits 32 with the analog memories 34 without crossing each other. In other words, the third example of the configuration of the pixel unit 3 eliminates the need for disposing the wires 36 in different wiring layers, which is needed when the wires 36 cross each other, thereby preventing parasitic capacitance between the wires 36 in the different wiring layers or preventing increase in the number of layers in the photoelectric conversion element 2.

Figure 6:
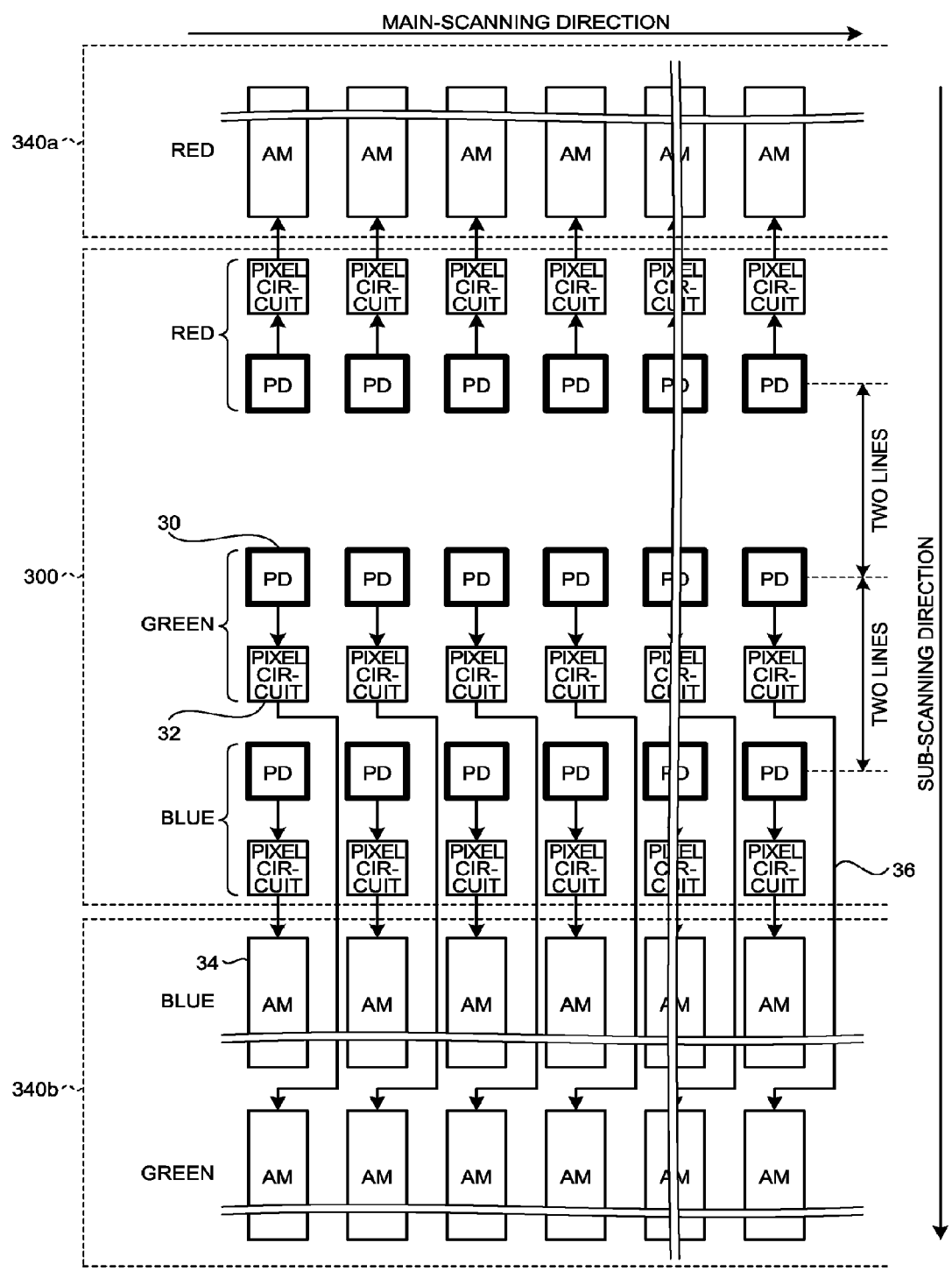
FIG. 6 is a diagram illustrating a fourth example of the configuration of the pixel unit.

FIG. 6 is a diagram illustrating a fourth example of the configuration of the pixel unit 3. In the configuration of the pixel unit 3 according to the fourth example as illustrated in FIG. 6, the aforementioned adjacent region 340 is separated into two regions, an adjacent region 340a and an adjacent region 340b. The adjacent regions 340a and 340b are separately disposed at the leading end and the trailing end of the photoelectric conversion region 300, respectively, in the sub-scanning direction and face each other with the photoelectric conversion region 300 interposed therebetween.

Specifically, in the configuration of the pixel unit 3 according to the fourth example, the rows of the light-receiving elements 30 and the pixel circuits 32 are arranged in the order of red, green, and blue in the sub-scanning direction. The adjacent region 340a including the analog memories 34 that store therein red signals is disposed at the leading end of the photoelectric conversion region 300 in the sub-scanning direction, and the adjacent region 340b including the analog memories 34 that store therein blue and green signals is disposed at the trailing end thereof. However, the pattern of the arrangement is not limited to this. The order of red, green, and blue may be changed to other orders, analog memories 34 for two colors may be disposed at the leading end of the sub-scanning direction, and analog memories 34 for the remaining one color may be disposed at the trailing end thereof.

With this configuration, the pixel circuits 32 and the analog memories 34 for certain two colors (red and blue in FIG. 6) are disposed adjacent to each other and thus the length of the wires between them is shortest. To connect the pixel circuits 32 with the analog memories 34 for the remaining color (green in FIG. 6), which are more distant from each other than those of the two colors, wires that are a little longer than the length of a single analog memory 34 are sufficient. When the total length of the wires 36 is reduced, impedance or parasitic capacitance can be reduced, thereby reducing the superimposition of various types of noises. In addition to this effect, this configuration prevents signal lines of different colors from running in parallel for a long distance, which can reduce the crosstalk between colors and prevent degradation of image quality.

Figure 7:
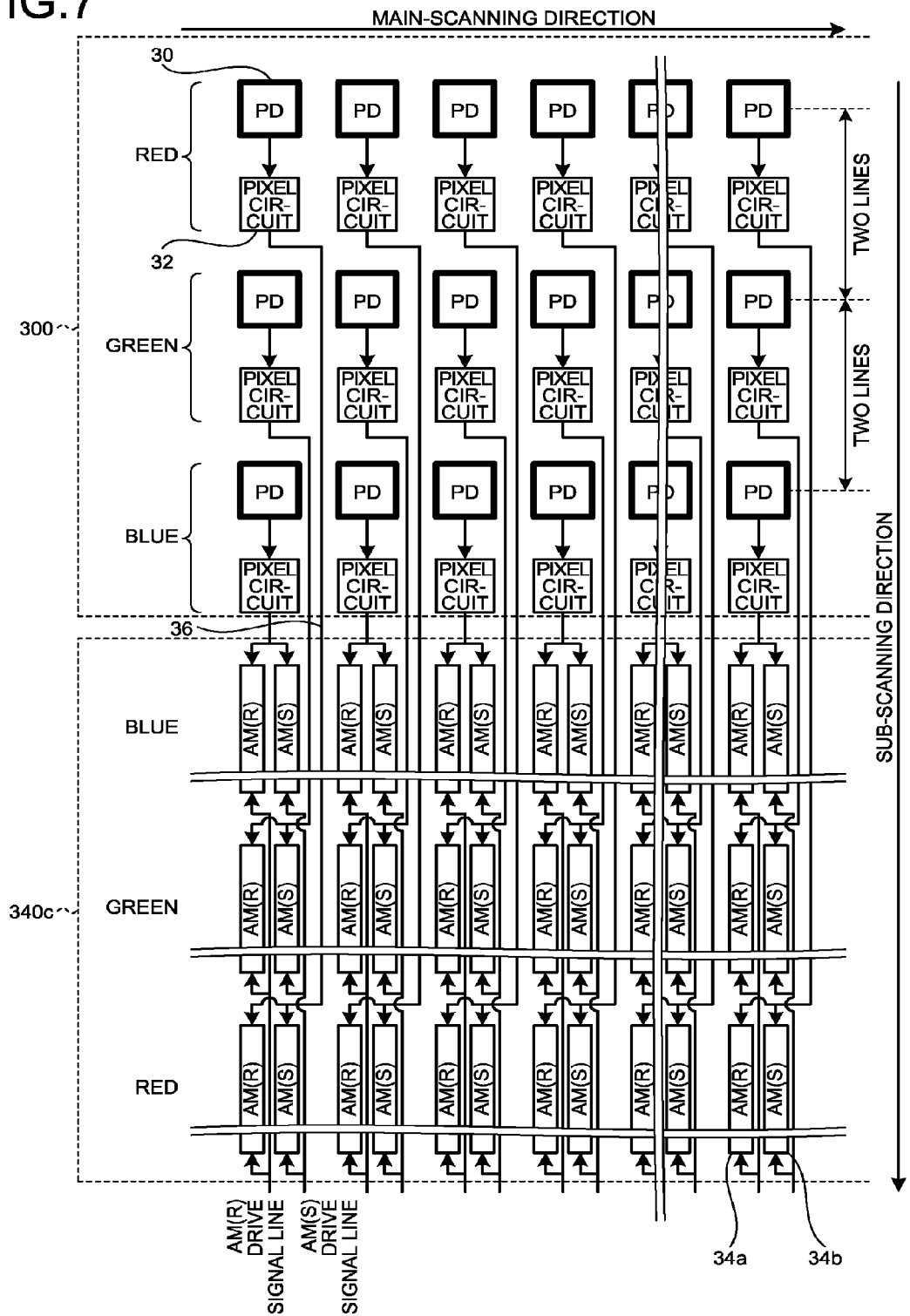
FIG. 7 is a diagram illustrating a fifth example of the configuration of the pixel unit.

FIG. 7 is a diagram illustrating a fifth example of the configuration of the pixel unit 3. As illustrated in FIG. 7, in an adjacent region 340c, analog memories 34a and 34b are provided for each of the light-receiving elements 30. Each of the analog memories 34a serves as a reset signal storage unit that stores therein a reset voltage signal output from the floating diffusion, which is reset to a predetermined reference voltage, of the corresponding pixel circuit 32. Each of the analog memories 34b serves as a storage unit that store therein the voltage generated by the corresponding pixel circuit 32 by the conversion of the electric charge accumulated in the corresponding light-receiving element 30 (during exposure) in the same manner as in the case of the analog memory 34 described above.

In other words, the configuration of the pixel unit 3 according to the fifth example is for implementing correlated double sampling (hereinafter referred to as CDS). In the CDS method, a voltage value stored in the analog memory 34a (AM(R)) is subtracted from a voltage value stored in the analog memory 34b (AM(S)) for each pixel to remove a fixed pattern noise. Such a subtraction function for implementing CDS may be included in any one of the components in the reading unit 1. In the fifth example, the analog memories 34a and 34b are alternately arranged in the alignment direction of the light-receiving elements 30. The order of the analog memory 34a and the analog memory 34b may be reversed in the row.

To implement the CDS function, twice the number of analog memories 34 are required compared to a case of no CDS function, but disposing the adjacent region 340c adjacent to the photoelectric conversion region 300 can reduce color shift while preventing decrease in sensitivity. The analog memories 34a and 34b are arranged in a regular order in a pattern symmetrical to that of the light-receiving elements 30 and the pixel circuits 32, thereby preventing a structural difference or production variance and reducing a difference in properties between pixels.

Figure 8:
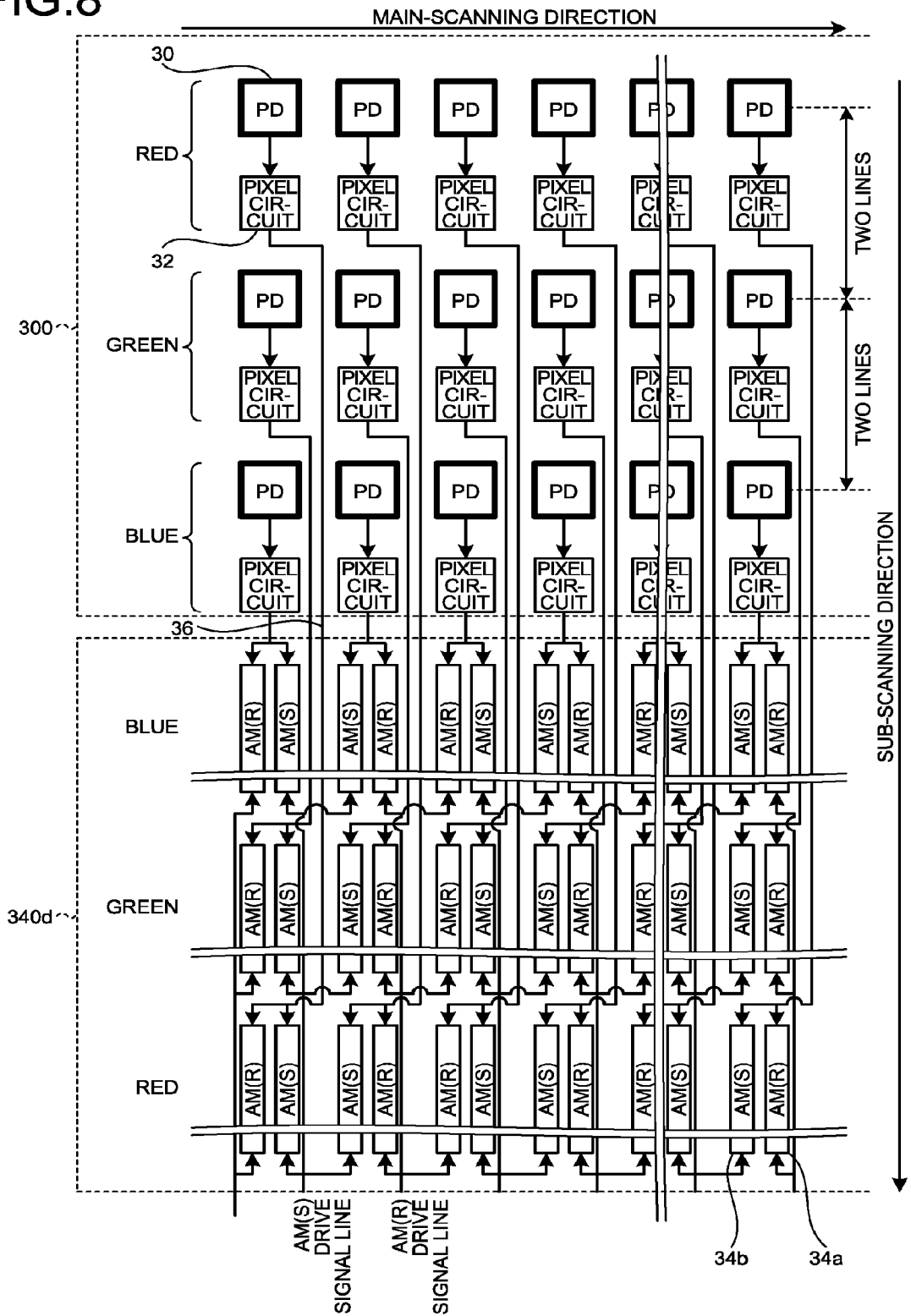
FIG. 8 is a diagram illustrating a sixth example of the configuration of the pixel unit.

FIG. 8 is a diagram illustrating a sixth example of the configuration of the pixel unit 3. As illustrated in FIG. 8, in an adjacent region 340d, the analog memories 34a and 34b are provided for each of the light-receiving elements 30. The analog memories 34a and 34b are arranged such that two analog memories 34a adjacent to each other alternate with two analog memories 34b adjacent to each other in the alignment direction of the light-receiving elements 30. The two adjacent analog memories 34a share one drive signal line that drives the analog memories 34a, and the two adjacent analog memories 34b share one drive signal line that drives the analog memories 34b. This configuration reduces the total number of drive signal lines.

Several examples of the configuration of the pixel unit 3 have been described, and these examples may be combined as appropriate.

Figure 9:
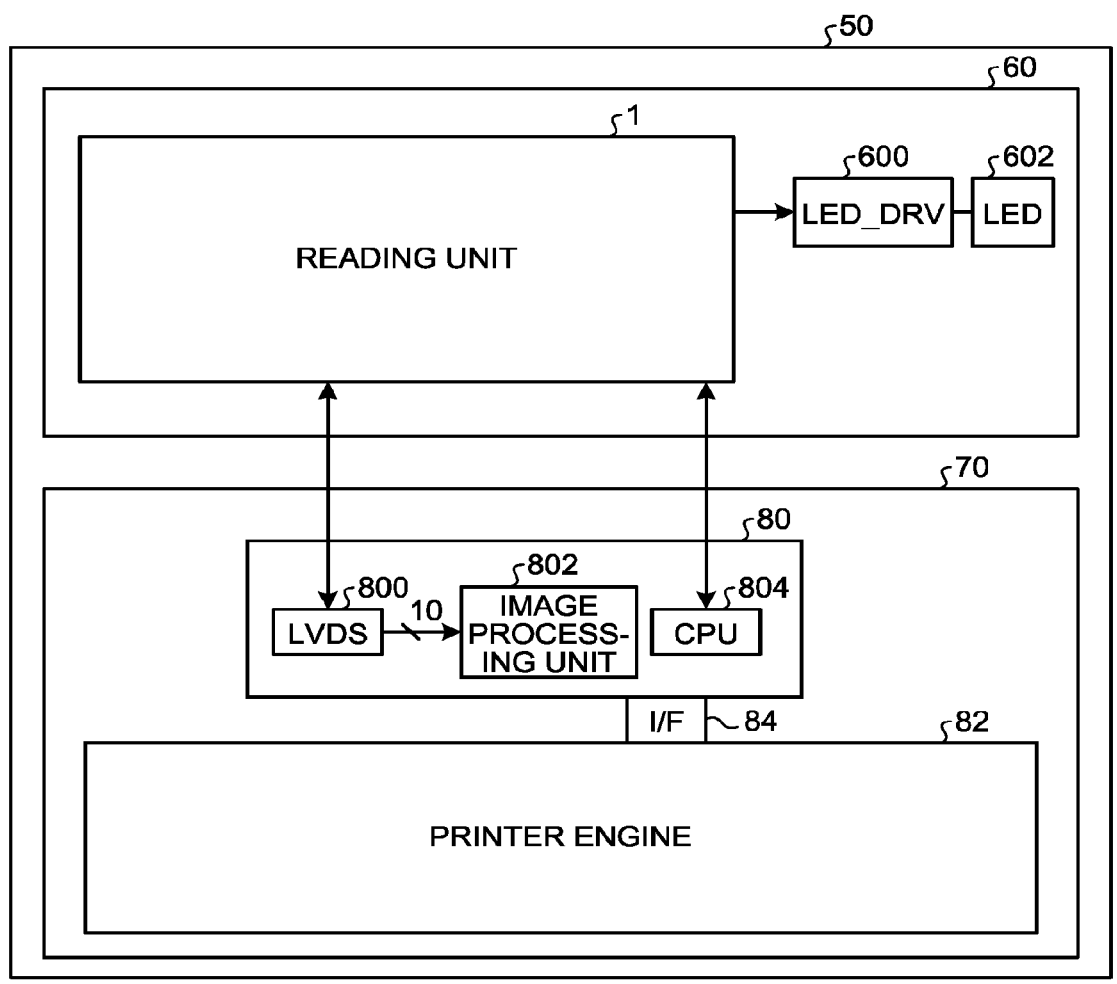
FIG. 9 is a diagram illustrating main components of an image forming apparatus including the image reading device including, for example, the photoelectric conversion element.

Described next is an image forming apparatus including the image reading device including the photoelectric conversion element according to the embodiment. FIG. 9 is a diagram illustrating main components of an image forming apparatus 50 including the image reading device 60 including, for example, the photoelectric conversion element 2. The image forming apparatus 50 is, for example, a copying machine or a multifunction peripheral (MFP) including the image reading device 60 and an image forming unit 70.

The image reading device 60 includes, for example, the reading unit 1, a light-emitting diode (LED) driver (LED_DRV) 600, and an LED 602. As described with reference to FIG. 1, the reading unit 1 includes the photoelectric conversion element 2. The LED driver 600 drives the LED 602 in synchronization with, for example, a line synchronization signal output from the reading unit 1. The LED 602 irradiates a document with light. In the reading unit 1, a plurality of light-receiving elements 30 receive reflected light from the document, generate electric charge, and start accumulating the charge in synchronization with, for example, the line synchronization signal. The reading unit 1 performs, for example, A/D conversion and parallel-to-serial conversion, and then outputs image data to the image forming unit 70.

The image forming unit 70 includes a processing unit 80 and a printer engine 82. The processing unit 80 and the printer engine 82 are connected with each other via an interface (I/F) 84.

The processing unit 80 includes an LVDS 800, an image processing unit 802, and a CPU 804. The CPU 804 controls the components such as the reading unit 1 that constitute the image forming apparatus 50. The CPU 804 (or the reading unit 1) controls the light-receiving elements 30 to start generating electric charge in accordance with the intensity of light at substantially the same instant in time.

The reading unit 1 outputs, for example, image data of an image read by the image reading device 60, the line synchronization signal, and transmission clock to the LVDS 800. The LVDS 800 converts, for example, the received image data, line synchronization signal, and transmission clock into parallel 10-bit data. The image processing unit 802 performs image processing by using the generated 10-bit data, and outputs, for example, the image data to the printer engine 82. The printer engine 82 performs printing by using the received image data.

According to the present invention, color shift can be reduced without decreasing sensitivity.

The above-described embodiments are illustrative and do not limit the present invention. Thus, numerous additional modifications and variations are possible in light of the above teachings. For example, at least one element of different illustrative and exemplary embodiments herein may be combined with each other or substituted for each other within the scope of this disclosure and appended claims. Further, features of components of the embodiments, such as the number, the position, and the shape are not limited the embodiments and thus may be preferably set. It is therefore to be understood that within the scope of the appended claims, the disclosure of the present invention may be practiced otherwise than as specifically described herein.

What is claimed is:

1. A photoelectric conversion element comprising:
   a plurality of light-receiving elements that are aligned in a predetermined alignment direction for each color of light to be received, to receive and convert the light into electric charge;
   a plurality of pixel circuits that are disposed respectively adjacent to the plurality of light-receiving elements, to convert the electric charge generated by the corresponding light-receiving element into a voltage signal; and
   a plurality of storage units that are disposed respectively corresponding to the plurality of pixel circuits, to store therein the voltage signal generated by the corresponding pixel circuit, the storage units being disposed in an adjacent region that is adjacent to a photoelectric conversion region in which the light-receiving elements and the pixel circuits are disposed, wherein
   each of the pixel circuits includes a floating diffusion and converts the electric charge generated by the light-receiving elements into the voltage signal by using the floating diffusion,
   the photoelectric conversion element further comprises a plurality of reset signal storage units in the adjacent region, the reset signal storage units each storing therein a reset voltage signal output from the floating diffusion that is reset to a predetermined reference voltage,
   every two storage units are arranged adjacent to each other in the alignment direction, and
   every two reset signal storage units are arranged adjacent to each other in the alignment direction.

2. The photoelectric conversion element according to claim 1, wherein the storage units are disposed in a single adjacent region and arranged in a same arrangement order of the arrangement of the light emitting elements and the pixel circuits respectively corresponding to the storage units.

3. The photoelectric conversion element according to claim 1, wherein the storage units are disposed in a single adjacent region and arranged in such a manner that
   in the alignment direction, an arrangement order of the storage units is the same as an arrangement order of the light emitting elements respectively corresponding to the storage units, but
   in a direction perpendicular to the alignment direction, an order of the colors of the light assigned to the storage units is a reversed order relative to an order of the colors of the light assigned to the light emitting elements.

4. The photoelectric conversion element according to claim 1, wherein the adjacent region is separated into two regions facing each other with the photoelectric conversion region interposed therebetween.

5. An image reading device comprising:
the photoelectric conversion element according to claim 1.

6. An image forming apparatus comprising:
the image reading device according to claim 5, and
an image forming unit that forms an image read by the image reading device.

7. The photoelectric conversion element according to claim 1, wherein the storage units and the reset signal storage units are alternately arranged in the alignment direction.

8. The photoelectric conversion element according to claim 1, further comprising:
a plurality of signal lines that connect the pixel circuits with the corresponding storage units to transmit the voltage signal generated by the pixel circuits to the corresponding storage units, wherein
the signal lines are disposed between the light-receiving elements.

9. The photoelectric conversion element according to claim 8, wherein the signal lines are disposed in a layer different from a layer in which a plurality of separation portions that separate the light-receiving elements from each other are disposed, the signal lines being disposed within a range overlapping the separation portions in a direction perpendicular to a stacking direction of the different layer.

10. A photoelectric conversion element comprising:
a plurality of light-receiving elements that are aligned in a predetermined alignment direction for each color of light to be received, to receive and convert the light into electric charge;
a plurality of pixel circuits that are disposed respectively adjacent to the plurality of light-receiving elements, to convert the electric charge generated by the corresponding light-receiving element into a voltage signal; and
a plurality of storage units that are disposed respectively corresponding to the plurality of the pixel circuits, to store therein the voltage signal generated by the corresponding pixel circuit, the storage units being disposed in an adjacent region that is adjacent to a photoelectric conversion region in which the light-receiving elements and the pixel circuits are disposed, wherein
each of the pixel circuits includes a floating diffusion and converts the electric charge generated by the light-receiving elements into the voltage signal by using the floating diffusion,
the photoelectric conversion element further comprises a plurality of reset signal storage units in the adjacent region, the reset signal storage units each storing therein a reset voltage signal output from the floating diffusion that is reset to a predetermined reference voltage, and
the storage units and the reset signal storage units are alternately arranged in the alignment direction.

11. The photoelectric conversion element according to claim 10, wherein the storage units are disposed in a single adjacent region and arranged in a same arrangement order of the arrangement of the light emitting elements and the pixel circuits respectively corresponding to the storage units.

12. The photoelectric conversion element according to claim 11, wherein the storage units are disposed in a single adjacent region and arranged in such a manner that
in the alignment direction, an arrangement order of the storage units is the same as an arrangement order of the light emitting elements respectively corresponding to the storage units, but
in a direction perpendicular to the alignment direction, an order of the colors of the light assigned to the storage units is a reversed order relative to an order of the colors of the light assigned to the light emitting elements.

13. An image reading device comprising:
the photoelectric conversion element according to claim 12.

14. An image forming apparatus comprising:
the image reading device according to claim 13, and
an image forming unit that forms an image read by the image reading device.

15. The photoelectric conversion element according to claim 7, wherein the adjacent region is separated into two regions facing each other with the photoelectric conversion region interposed therebetween.

16. The photoelectric conversion element according to claim 7, further comprising:
a plurality of signal lines that connect the pixel circuits with the corresponding storage units to transmit the voltage signal generated by the pixel circuits to the corresponding storage units, wherein
the signal lines are disposed between the light-receiving elements.

17. The photoelectric conversion element according to claim 16, wherein the signal lines are disposed in a layer different from a layer in which a plurality of separation portions that separate the light-receiving elements from each other are disposed, the signal lines being disposed within a range overlapping the separation portions in a direction perpendicular to a stacking direction of the different layer.

18. A photoelectric conversion element comprising:
a plurality of light-receiving elements that are aligned in a predetermined alignment direction for each color of light to be received, to receive and convert the light into electric charge;
a plurality of pixel circuits that are disposed respectively adjacent to the plurality of light-receiving elements, to convert the electric charge generated by the corresponding light-receiving element into a voltage signal; and
a plurality of storage units that are disposed respectively corresponding to the plurality of the pixel circuits, to store therein the voltage signal generated by the corresponding pixel circuit, the storage units being disposed in an adjacent region that is adjacent to a photoelectric conversion region in which the light-receiving elements and the pixel circuits are disposed; and
a plurality of signal lines that connect the pixel circuits with the corresponding storage units to transmit the voltage signal generated by the pixel circuits to the corresponding storage units, wherein
the signal lines are disposed between the light-receiving elements,
the signal lines are disposed in a layer different from a layer in which a plurality of separation portions that separate the light-receiving elements from each other are disposed, the signal lines being disposed within a range overlapping the separation portions in a direction perpendicular to a stacking direction of the layers.

19. The photoelectric conversion element according to claim 18, wherein the storage units are disposed in a single adjacent region and arranged in a same arrangement order of the arrangement of the light emitting elements and the pixel circuits respectively corresponding to the storage units.

20. The photoelectric conversion element according to claim 18, wherein the storage units are disposed in a single adjacent region and arranged in such a manner that
in the alignment direction, an arrangement order of the storage units is the same as an arrangement order of the light emitting elements respectively corresponding to the storage units, but
in a direction perpendicular to the alignment direction, an order of the colors of the light assigned to the storage units is a reversed order relative to an order of the colors of the light assigned to the light emitting elements.

21. An image reading device comprising:
the photoelectric conversion element according to claim 19.

22. An image forming apparatus comprising:
the image reading device according to claim 21, and
an image forming unit that forms an image read by the image reading device.

23. The photoelectric conversion element according to claim 18, wherein the adjacent region is separated into two regions facing each other with the photoelectric conversion region interposed therebetween.

24. The photoelectric conversion element according to claim 18, wherein
each of the pixel circuits includes a floating diffusion and converts the electric charge generated by the light-receiving elements into the voltage signal by using the floating diffusion,
the photoelectric conversion element further comprises a plurality of reset signal storage units in the adjacent region, the reset signal storage units each storing therein a reset voltage signal output from the floating diffusion that is reset to a predetermined reference voltage.

25. The photoelectric conversion element according to claim 24, wherein
every two storage units are arranged adjacent to each other in the alignment direction, and
every two reset signal storage units are arranged adjacent to each other in the alignment direction.

26. The photoelectric conversion element according to claim 24, wherein the storage units and the reset signal storage units are alternately arranged in the alignment direction.

* * * * *